United States Patent [19]

Kundu

[11] Patent Number: 5,692,148
[45] Date of Patent: Nov. 25, 1997

[54] METHOD AND APPARATUS FOR IMPROVING SYSTEM MEMORY COST/PERFORMANCE USING EXTENDED DATA OUT (EDO)DRAM AND SPLIT COLUMN ADDRESSES

[75] Inventor: Aniruddha Kundu, Hillsboro, Oreg.

[73] Assignee: Intel Corporation, Santa Clara, Calif.

[21] Appl. No.: 225,522

[22] Filed: Apr. 11, 1994

[51] Int. Cl.[6] .................... G06F 12/06; G06F 13/00; G11C 8/00; G11C 7/00
[52] U.S. Cl. .................... 395/432; 395/494; 395/405; 395/421.07; 365/193; 365/233; 365/230.08
[58] Field of Search .................... 395/432, 438, 395/494, 550, 405, 421.07, 421.08, 421.09, 421.1; 365/233, 193, 203, 230.08

[56] References Cited

U.S. PATENT DOCUMENTS

| | | | |
|---|---|---|---|
| 4,707,811 | 11/1987 | Takemae et al. | 365/233 |
| 4,792,929 | 12/1988 | Olson et al. | 365/233 |
| 4,953,130 | 8/1990 | Houston | 365/203 |
| 5,305,271 | 4/1994 | Watanabe | 365/189.05 |
| 5,349,566 | 9/1994 | Merritt et al. | 365/193 |
| 5,436,865 | 7/1995 | Kitazawa | 365/233 |

FOREIGN PATENT DOCUMENTS 3-232185  10/1991  Japan.

OTHER PUBLICATIONS

"Samsung Extended Data Out DRAM KM44C4004A," Samsung Product Information, dated May 1994, pp. 67–74.
"Early Restore of Column Address Strobe for Dense Random–Access Memories in Page Mode," IBM Tech. Disc. Bull, vol. 28, No. 8, Jan. 1986, pp. 3540–3541.

Primary Examiner—Glenn Gossage
Attorney, Agent, or Firm—Blakely, Sokoloff, Taylor & Zafman

[57] ABSTRACT

A computer system is provided with a system memory unit comprising memory address and control signal generation circuitry, a number of banks of extended data out dynamic random access memory (EDODRAM), and a number of registers. The memory address and control signal generation circuitry generates memory addresses for the banks of EDODRAM, advantageously delivered over two address buses. The most significant bits (MSBs) of the memory addresses are buffered and delivered to the banks of EDO-DRAM over a first address bus, while the least significant bits (LSBs) of the memory addresses are "split" off and directly delivered, unbuffered, to the banks of EDODRAM over a second address bus to allow a column address to change at a faster rate by bypassing the buffer. Additionally, the memory address and control signal generation circuitry generates control signals for the banks of EDODRAM and the registers, including a column address strobe (CAS) signal with "shortened" active periods. The banks of EDO-DRAM accept, store, and output data, in accordance with memory addresses provided. The registers stage data being streamed out of or into the banks of EDODRAM. As a result of the manner in which the memory addresses and the CAS signals are provided, the cycle time of a memory access is reduced, even if slower complementary metal oxide semiconductor (CMOS) technology based circuit elements are used to constitute the memory address and control signal generation circuitry, the EDODRAM, and the registers.

6 Claims, 5 Drawing Sheets

METHOD AND APPARATUS FOR IMPROVING SYSTEM MEMORY COST/PERFORMANCE USING EXTENDED DATA OUT (EDO)DRAM AND SPLIT COLUMN ADDRESSES

BACKGROUND OF THE INVENTION

1. Field of the Invention

The present invention relates to the field of computer systems. More specifically, the present invention relates to system memory of computer systems.

2. Background Information

All computer systems include some amount of system memory. System memory is substantially slower than the processor. Most computer systems further include cache memory to bridge the performance gap between the processor and the system memory. While cache memory is also slower than the processor, it is faster than system memory. As processor speed continues to increase, various techniques have been developed to allow cache memory to keep up with the faster processors. Some of these improved cache memory units are capable of performing a cache access in as little as six clock cycles at 66 MHz processor speed (15 nanoseconds (ns) per clock period). The improved cycle time represents 30%–50% reduction of the cycle time required by the traditional cache memory units. In contrast, the memory access cycle time for the most common system memory units using complementary metal oxide semiconductor (CMOS) technology based dynamic random access memory (DRAM) has remained pretty much unchanged, requiring 18–20 clock cycles at 66 MHz. Therefore, it is desirable to be able to reduce the memory access cycle time of system memory to keep pace with the improved cache memory.

One emerging solution to the "slow" system memory problem is to use faster Synchronous DRAMs (SDRAMs) based on bipolar CMOS (bi-CMOS) technology. SDRAMs are about 100% faster than the conventional DRAMs. As a result, these faster system memory units can reduce the cycle time of a memory access by almost 50%. At 66 MHz, a memory access can be completed in as little as seven to ten clock cycles. However, today, SDRAMs cost twice as much as the conventional DRAMs. In other words, it takes almost 100% increase in system memory cost to achieve 50% reduction in memory access cycle time. Thus, the faster system memory unit using SDRAMs is not an economically viable solution for the low end computer systems, such as entry level microprocessor based portable or desktop computers.

Thus, it is desirable to close the performance gap between the improved cache memory and the "slow" system memory with a much more cost effective solution. As will be disclosed in more detail below, the present invention advantageously achieves these and other desirable results.

SUMMARY OF THE INVENTION

According to the present invention, the desired results are advantageously achieved by providing a computer system with a system memory unit comprising memory address and control signal generation circuitry, a buffer, a number of banks of extended data out dynamic random access memory (EDODRAM, also known as Hyperpage DRAM in the art), and a number of registers. The memory address and control signal generation circuitry generates memory addresses for the banks of EDODRAM, advantageously delivered over two address bus lines. Additionally, the memory address and control signal generation circuitry generates control signals for the banks of EDODRAM and the registers, including a column address strobe (CAS) signal with "shortened" active periods. The banks of EDODRAM accept, store, and output data, in accordance to the memory addresses provided. The registers stage the data being streamed out of or into the banks of EDODRAM. As a result of the manner of delivering memory addresses and CAS signals to the banks of EDODRAM, the cycle time of a memory access is reduced, even if slower CMOS technology based circuit elements are used to constitute the memory address and control signal generation circuitry, the buffer, the EDODRAM, and the registers.

During operation, the memory address and control signal generation circuitry provides the most significant bits (MSBs) of the generated memory addresses over one address bus line through the buffer, and the least signficant bits (LSBs) of the generated memory addresses over another address bus line unbuffered, thereby allowing the memory addresses to be rapidly changed. The memory address and control signal generation circuitry, exploiting the independence of EDODRAM's data out relative to the CAS signal, shortens the active period of the CAS signal for each column address to allow early precharge of memory cells and in turn faster response to the next column address.

Experience has shown that at a processor speed of 66 MHz, a memory access can be performed in accordance to the present invention in about 11–13 clock cycles, which represents around 35% reduction in cycle time, even when conventional CMOS technology based circuit elements are used to constitute the system memory unit. More importantly, the 35% reduction in cycle time is achieved with very little increase in cost.

DETAILED DESCRIPTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatic or block diagram form in order not to obscure the present invention unnecessarily.

Figure 1:
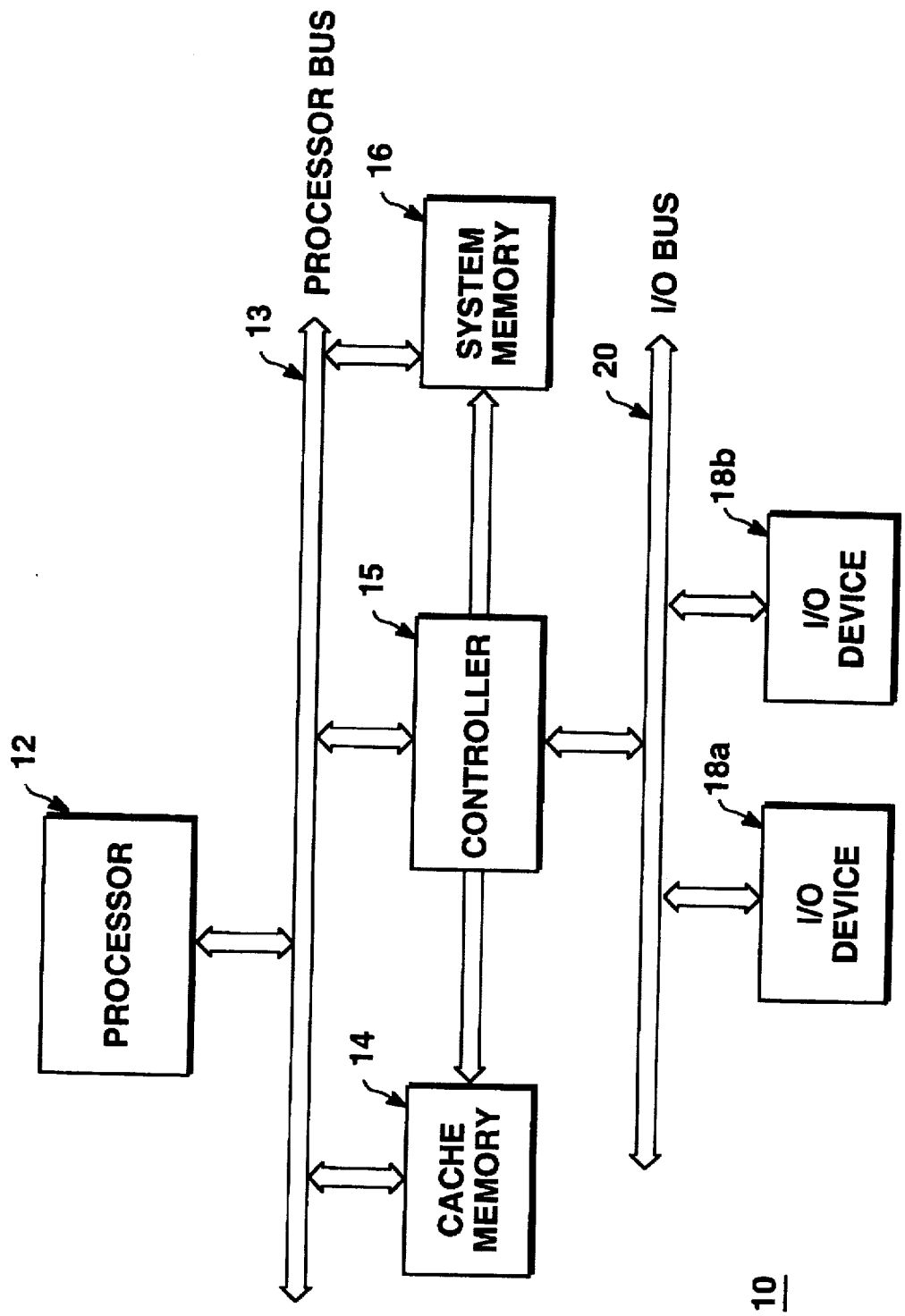
FIGS. 1 illustrates an exemplary computer system incorporating the teachings of the present invention.

Referring now to FIG. 1, a block diagram illustrating an exemplary computer system incorporating the teachings of the present invention is shown. The exemplary computer system 10 comprises a processor 12, a cache memory 14, a system memory 16, and a controller 15 coupled to each other a processor bus 13 and shown. Additionally, the exemplary computer system 10 further comprises a number of (input/output) I/O devices 18 coupled to the controller 15 through an I/O bus 20. In the presently preferred embodiment, the processor 12 is disposed in a single integrated circuit (chip). The processor chip, the cache memory 14, the system memory 16, the controller 15, and the two buses 13 and 20 are disposed on a single circuit board. Except for the system memory unit 16, the processor 12, the cache memory 14, and the I/O bus 20 are intended to represent a broad category of these elements found in many computer systems. Their constitutions and functions are well known and will not be further described.

While the present invention is being described with the exemplary computer system having the illustrated architecture, and the above described disposition, based on the description to follow, it will be appreciated that the present invention may be practiced with computer systems having different architectures and these elements physically disposed in other manners.

Figure 2:
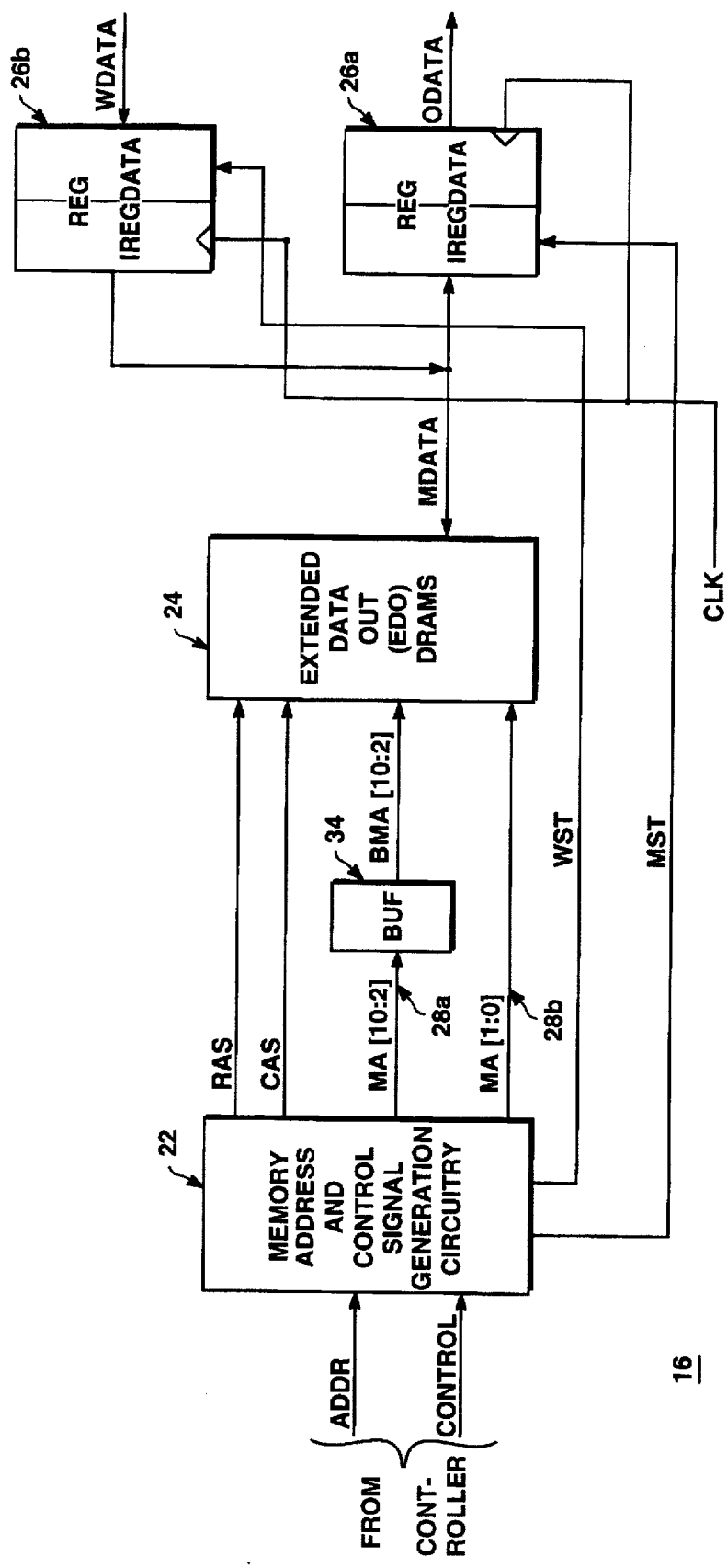
FIG. 2 illustrates the relevant portions of one embodiment of the system memory unit of FIG. 1 in further detail.

Referring now to FIG. 2, a block diagram illustrating the relevant portions of one embodiment of the system memory 16 of FIG. 1 in further detail. As illustrated, the system memory 16 comprises memory address and control signal generation circuitry 22, a number of banks of EDODRAM 24, a number of registers 26a–26b, and a buffer 34, coupled to each other as shown. As illustrated, the coupling between memory address and control signal generation circuitry 22 and the banks of EDODRAM 24 includes at least two address bus lines 28a and 28b. The banks of EDODRAM 24 are organized in pages.

The memory address and control signal generation circuitry 22 generates memory addresses for the banks of EDODRAM 24. Additionally, the memory address and control signal generation circuitry 22 generates control signals for the banks of EDODRAM 24 and the registers 26a–26b. Unlike the prior art, buffer 34 buffers only the most significant bits (MSBs) of the memory addresses. Similar to the prior art, the buffer 34 is employed to reduce the amount of power required to drive the MSBs of the memory addresses over the first address bus line 28a for the banks of EDODRAM 24, since typically system memory includes a large number of banks. The banks of EDODRAM 24 accept, store, and output data. The banks of EDORAM 24 store and output data in accordance to the memory addresses provided. The registers 26a–26b stage the data being stored into or output from the banks of EDODRAM 24.

During operation, the memory address and control signal generation circuitry 22 receives address and control signals from the controller 15. In response, the memory address and control signal generation circuitry 22 generates memory addresses for the banks of EDODRAM 24. Additionally, the memory address and control signal generation circuitry 22 provides control signals to the banks of EDODRAM 24 and the registers 26a–26b, including a row address strobe signal (RAS) and a column address strobe signal (CAS) for the banks of EDODRAM 24, and read and write store signals (MST and WST) for the registers 26a–26b. The controller 15 also generates all other control signals as needed by the banks of EDODRAM 24.

As illustrated, the MSBs of the memory addresses, row or column, are provided to the banks of EDODRAM 24 over the first address bus line 28a through the buffer 34, whereas the LSBs of the memory addresses, are provided to the banks of EDODRAM 24 over the second address bus line 28b unbuffered. As will be described in more detail below, as a result of the manner of providing the memory addresses to the banks of EDODRAM 24, the memory addresses, in particular the column addresses, are provided at a faster rate to the banks of EDODRAM 24. Additionally, the memory address and control signal generation circuitry 22, exploiting the independence of EDODRAM's data out relative to the CAS signal, advantageously shortens the active period of the CAS for each column memory address to allow early precharge of the memory cells. As will be also described in more detail below, as a result of the manner of providing the CAS signal, data are streamed out of or into the banks of EDODRAM 24 at a faster rate. Together, the faster provision of memory addresses and the faster response of the banks of EDODRAM 24 result in reduction in the total cycle time of a memory access.

The banks of EDODRAM 24 receive the memory addresses and the control signals as inputs. In response, the banks of EDODRAM 24 stream data (MDATA) out of or into the memory cells. The register 26a stores each of the data being streamed out of the banks of EDODRAM 24 for a read access momentarily to accommodate processor set up time, responsive to the MST signal. The register 26b stores each of the data being streamed into the banks of EDO-DRAM 24 for a write access momentarily for symmetry of operation, responsive to the WST signal.

The memory address and control signal generation circuitry 22 will be described in more detail below. A particular example of EDODRAM 24 is CMOS technology based KM44C4004A manufactured by Samsung Corporation of Korea, having operating speeds of 60 ns for data out from RAS and 15 ns for data out from CAS. The registers 26a–26b are well known and will not be further described. The timing of the key signals to effectuate the consecutive and rapid streaming of data out of and into the banks of EDODRAM 24 will be described in more detail below.

Figure 3:
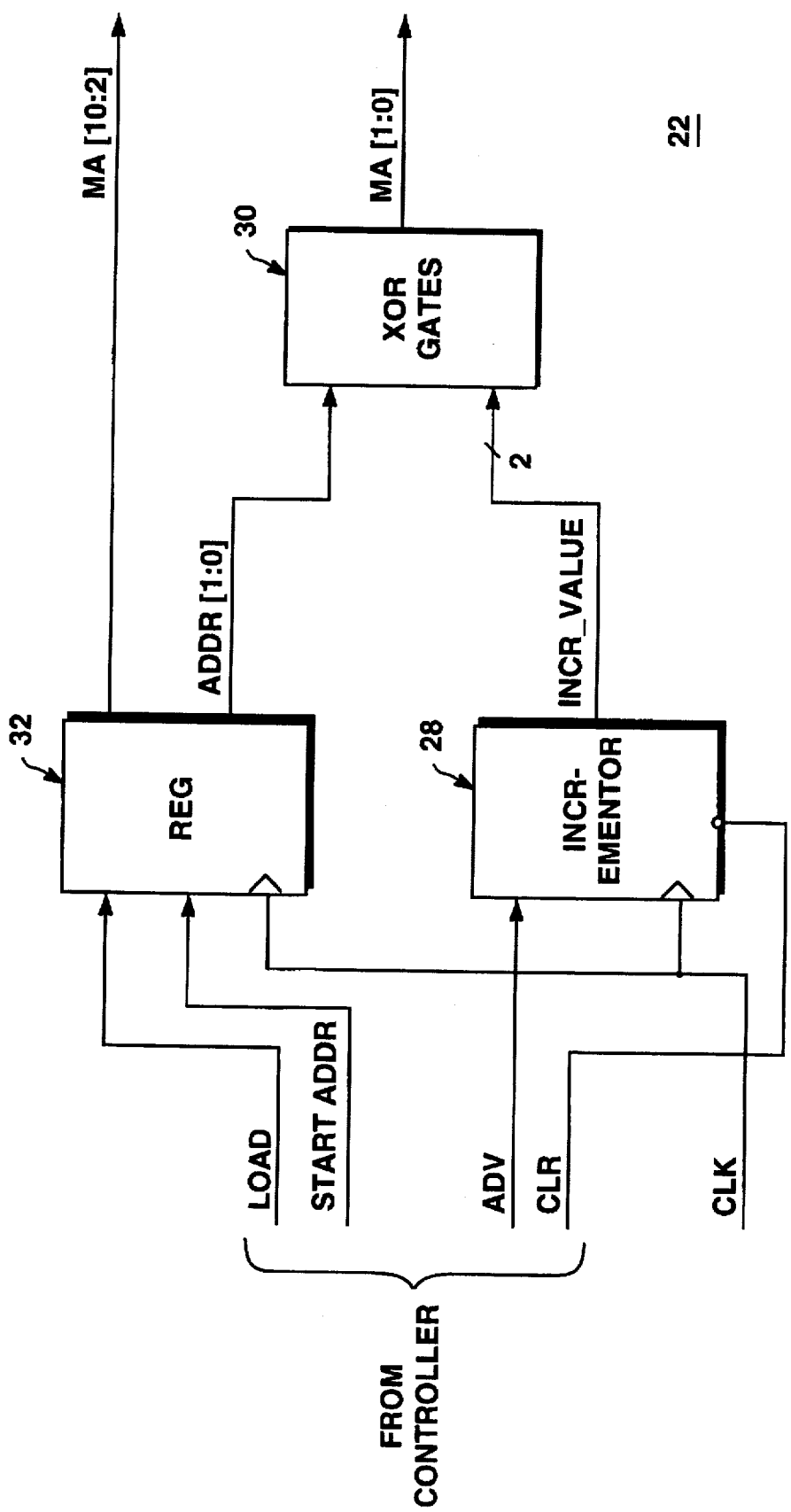
FIG. 3 illustrates the key elements of the address generation portion of one embodiment of the memory address and control signal generation circuitry of FIG. 2 in further detail.

Referring now to FIG. 3, a block diagram illustrating the key element of the address generation portion of one embodiment of the memory address and control signal generation circuitry 22 of FIG. 2 in further detail is shown. The control signal generation portion of the memory address and control signal generation circuitry 22 may be implemented in any number of manners known in the art. As illustrated, the address generation portion 23 comprises a register 32, an incrementor 28, and an assembly of exclusive-OR (XOR) gates 30, coupled to each other as shown. The register 32 stores a start address received from the controller 15. The incrementor 28 generates a predetermined series of increment values. The assembly of XOR gates 20 generates the LSBs of the memory addresses by performing a series of logical XOR operations against the LSBs of the stored start address read out of the register 32, and the generated increment values.

The manner in which the incrementor 28 generates the increment values, and the XOR operations performed are dependent on the system memory access characteristics of the processor 12 and/or the cache memory 14. For example, for Intel Corporation's Pentium™ processor, if the addresses for a line fill are 0x00001010H, 0x00001018H, 0x00001000H, and 0x00001008H, the row addresses are 0x000H, whereas the column addresses are 0x202H, 0x203H, 0x200H, and 0x201H. In other words, MA[10:2]s are identical or common, i.e., 0x200H, for all four column addresses, and MA[1:0]s are different or uncommon, i.e., 0x2H, 0x3H, 0x0H, and 0x1H, for the four column addresses.

The LSBs of the memory addresses are "splitted off" and delivered directly to the banks of EDODRAM 24 over the second address bus line 28b unbuffered, to allow the column address to be changed at a faster rate by bypassing the buffer 34 and saving the time otherwise would have incurred in changing the content of the buffer 34 when changing the column address. Since only a small number of bits are being driven directly for the banks of EDODRAM 24, the faster rate of delivering column addresses is achieved with minimal increase in power requirement of the memory address and control signal generation circuitry 22.

Figure 4A:
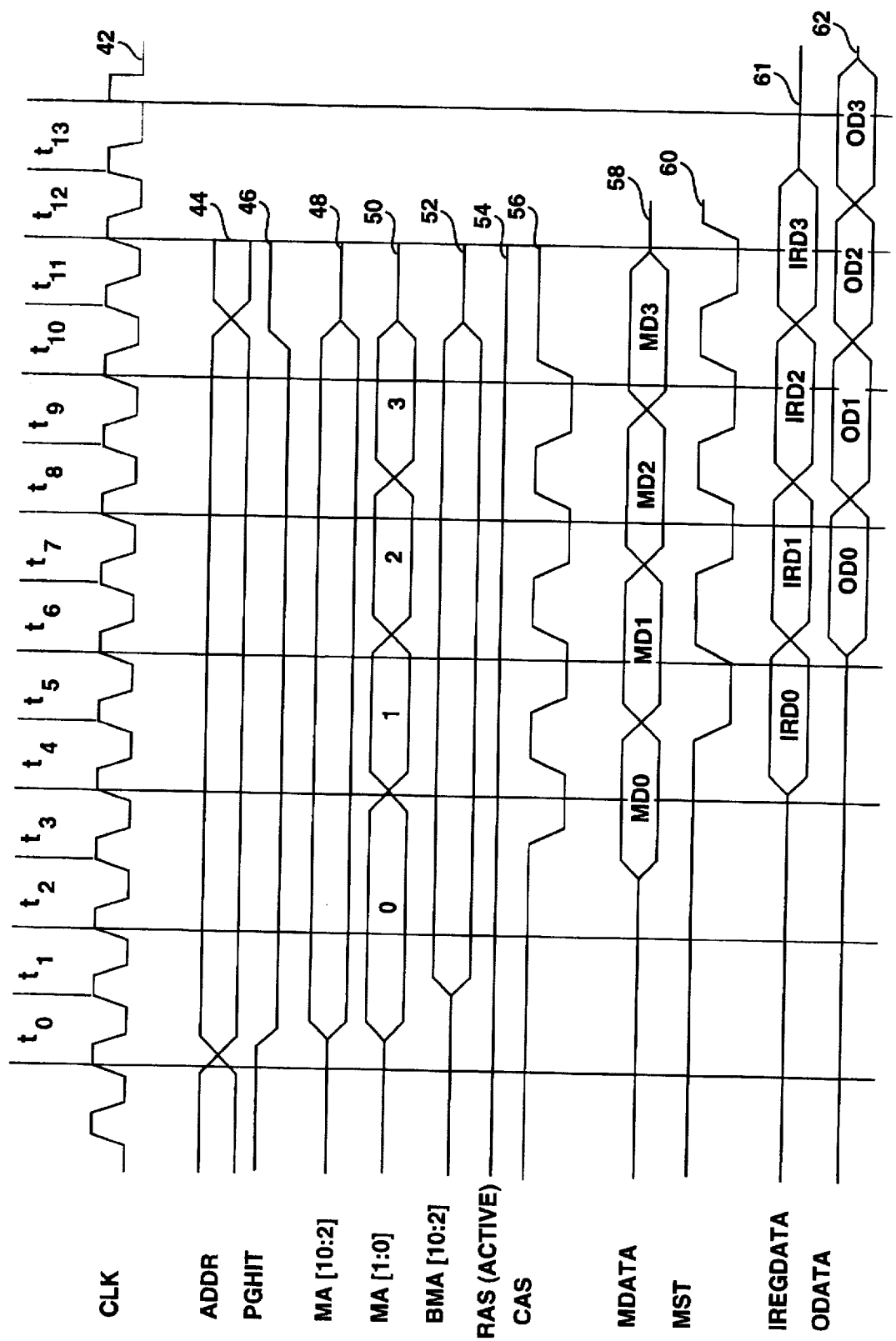
FIGS. 4a–4b are two timing diagrams for the system memory unit of FIG. 1 operating at an exemplary processor speed of 66 MHz.
Figure 4B:
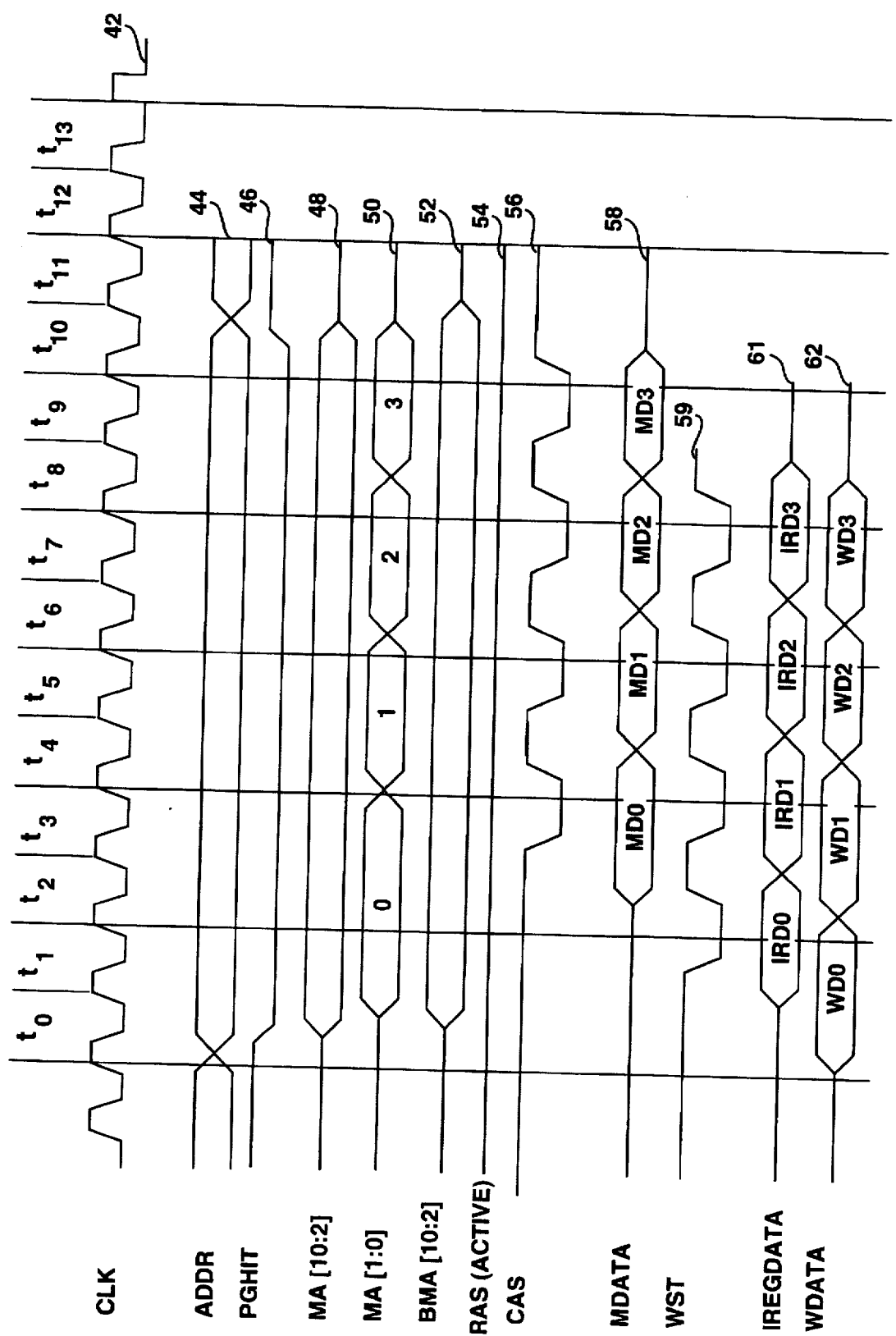

Referring now to FIGS. 4a–4b, two timing diagrams illustrating the relative timing for a number of key signals for a read and a write access against the system memory 16 of FIG. 1 are shown. The relative timings of both diagrams are illustrated at an exemplary processor speed of 66 MHz (15 ns per clock period) 42, and assuming page hit, i.e. the row memory address remains unchanged from the prior access. Thus, for both the read and the write access, the page hit signals (PGHIT) 46, and the RAS signals 52 are simply maintained active through the entire duration ($t_0$ through $t_{10}$) as shown in the two diagrams. Similarly, the MSBs of the column address (MA[10:2]) 48, and therefore the buffered MSBs (BMA[10:2]) 52 are maintained for the entire duration ($t_0$ through $t_{10}$) as shown in the two diagrams.

Referring now only to FIG. 4a, for a read access, since the LSBs of the column addresses can be generated rapidly, and except for the first column address, the subsequent column addresses are responded to in 15 ns, the LSBs of the column addresses (MA[1:0]) 50 are provided and maintained using about 11 clock periods ($t_0$ through $t_{10}$) as illustrated. The CAS signal 56 is set to active correspondingly and reset to inactive early w in eight clock periods ($t_3$ through $t_{10}$) as illustrated.

Thus, the memory data (MDATA) 58 are detected in the nine clock periods ($t_3$ through $t_{11}$) as illustrated. The internal register data (iREGDATA) 61 are stored in the nine clock periods ($t_4$ through $t_{12}$) as illustrated. The MST signal 60 is therefore set to active correspondingly in the eight clock periods ($t_5$ through $t_{12}$) as illustrated. As a result, read data (ODATA) are detected in the eight clock periods ($t_6$ through $t_{13}$) as illustrated. In other words, the total cycle time for a read access is performed in 13 clock periods, a 35% improvement over the prior art in total cycle time, even if slower CMOS technology based EDODRAM are used.

Referring now only to FIG. 4b, for a write access, similarly, since the LSBs of the column addresses can be generated rapidly, and except for the first column address, the subsequent column addresses are responded to in 15 ns, the LSBs of the column addresses (MA[1:0]) 50 are provided and maintained using about 11 clock periods ($t_0$ through $t_{10}$) as illustrated. The CAS signal 54 is set to active correspondingly and reset to inactive early in eight clock periods ($t_3$ through $t_{10}$) as illustrated.

Thus, with the write data 63 supplied using nine clock periods ($t_0$ through $t_8$) as illustrated, the internal register data (iREGDATA) 61 are stored in the nine clock periods ($t_4$ through $t_{12}$) as illustrated. The WST signal 59 is set to active correspondingly in the eight clock periods ($t_1$ through $t_8$) as illustrated. As a result, memory data are available for storage in the nine clock periods ($t_2$ through $t_{10}$) as illustrated. In other words, the total cycle time for a write access is performed in 11 clock periods, a 39% improvement over the prior art in total cycle time, even if slower CMOS technology based EDODRAM are used.

While the present invention has been described in terms of presently preferred and alternate embodiments, those skilled in the art will recognize that the invention is not limited to the embodiment described. The method and apparatus of the present invention can be practiced with modification and alteration within the spirit and scope of the appended claims. The description is thus to be regarded as illustrative instead of limiting on the present invention.

What is claimed is:

1. An apparatus comprising:

(a) address and control signal generation circuitry for receiving a start address of a memory access to a memory unit of a computer system, and in response, generating a series of memory addresses including a series of column addresses, and a plurality of control signals including a column address strobe (CAS) signal to perform the memory access, the memory unit comprising a plurality of banks of extended data out dynamic random access memory (EDODRAM), the column addresses being generated as a set of high order address bits common to all the column addresses, supplemented by particularized sets of low order address bits, one particularized set for each of the column addresses, and the CAS signal being generated with a plurality of corresponding active periods, one active period for each column address, with each active period being shorter in time than an amount of time required by a memory cell of the banks of EDODRAM to output or store data, to allow early precharge of memory cells of the banks of EDODRAM in preparation for response to the next column address;

(b) a buffer coupled to the address and control signal generation circuitry for storing and outputting the set of high order address bits during the memory access to lower power required of the address and control signal generation circuitry to provide the set of high order address bits to the banks of EDODRAM;

(c) a first address bus coupled to the buffer for delivering the set of high order address bits to the banks of EDODRAM; and (d) a second address bus coupled to the address and control signal generation circuitry for directly delivering the particularized sets of low order address bits to the banks of EDODRAM, bypassing the buffer, to allow the particularized sets of low order address bits, and therefore the column addresses, to be rapidly provided to the banks of EDODRAM.

2. The apparatus as set forth in claim 1, wherein the address and control signal generation circuitry includes an address generation portion having (a.1) a register for receiving and storing the start address;

(a.2) an incrementor for receiving a start increment value and generating a plurality of incremental values in a predetermined manner; and (a.3) an exclusive-OR (XOR) gate assembly coupled to said register and said incrementor for generating the particularized sets of low order address bits using said start address and said incremental values.

3. An apparatus comprising:

(a) a plurality of banks of extended data out dynamic random access memory (EDODRAM) for storing data;

(b) address and control signal generation circuitry for receiving a start address of a memory access to the banks of EDODRAM, and in response, generating a series of memory addresses including a series of column addresses, and a plurality of control signals including a column address strobe (CAS) signal to perform the memory access, the column addresses being generated as a set of high order address bits common to all the column addresses, supplemented by particularized sets of low order address bits, one particularized set for each of the column addresses, and the CAS signal being generated with a plurality of corresponding active periods, one active period for each column address, with each active period being shorter in time than an amount of time required by a memory cell of the banks of EDODRAM to output or store data, to allow early precharge of memory cells of the banks of EDODRAM in preparation for response to the next column address;

(c) a buffer coupled to the address and control signal generation circuitry for storing and outputting the set of high order address bits during the memory access to lower power required of the address and control signal generation circuitry to provide the set of high order address bits to the banks of EDODRAM;

(d) a first address bus coupled to the buffer and the banks of EDODRAM for delivering the set of high order address bits to the banks of EDODRAM; and (e) a second address bus coupled to the address and control signal generation circuitry and the banks of EDODRAM for directly delivering the particularized sets of low order address bits to the banks of EDODRAM, bypassing the buffer, to allow the particularized sets of low order address bits, and therefore the column addresses, to be rapidly provided to the banks of EDODRAM.

4. The apparatus as set forth in claim 3, wherein the address and control signal generation circuitry includes an address generation portion having (b.1) a register for receiving and storing the start address;

(b.2) an incrementor for receiving a start increment value and generating a plurality of incremental values in a predetermined manner; and (b.3) an exclusive-OR (XOR) gate assembly coupled to said register and said incrementor for generating the particularized sets of low order address bits using said start address and said incremental values.

5. In a computer system comprising system memory comprising a plurality of banks of extended data out dynamic random access memory (EDODRAM), a method for accessing the banks of EDODRAM, the method comprising the steps of:

(a) receiving a start address of a memory access to the banks of EDODRAM;

(b) generating a series of memory addresses including a series of column addresses, and a plurality of control signals including a column address strobe (CAS) signal to perform the memory access, the column addresses being generated as a set of high order address bits common to all the column addresses, supplemented by particularized sets of low order address bits, one particularized set for each of the column addresses, and the CAS signal being generated with a plurality of corresponding active periods, one active period for each column address, with each active period being shorter in time than an amount of time required by a memory cell of the banks of EDODRAM to output or store data, to allow early precharge of memory cells of the banks of EDODRAM in preparation for response to the next column address;

(c) buffering and then outputting the set of high order address bits during the memory access to lower power required of the address and control signal generation circuitry to provide the set of high order address bits to the banks of EDODRAM;

(d) delivering the set of high order address bits to the banks of EDODRAM via a first address bus coupling the buffer to the banks of EDODRAM; and (e) directly delivering the particularized sets of low order address bits to the banks of EDODRAM, via a second address bus coupling the address and control signal generation circuitry to the banks of EDODRAM, bypassing the buffer, to allow the particularized sets of low order address bits, and therefore the column addresses, to be rapidly provided to the banks of EDODRAM.

6. The method as set forth in claim 5, wherein step (a) comprises (a.1) receiving and storing the start address;

(a.2) receiving a start increment value and generating a plurality of incremental values in a predetermined manner; and (a.3) generating the particularized sets of low order address bits by performing a plurality of exclusive-OR (XOR) operations using said start address and said incremental values.

* * * * *